US008780600B2

(12) United States Patent  
Fai et al.

(10) Patent No.: US 8,780,600 B2  
(45) Date of Patent: Jul. 15, 2014

(54) SYSTEMS AND METHODS FOR STACKED SEMICONDUCTOR MEMORY DEVICES

(75) Inventors: Anthony Fai, Palo Alto, CA (US); Nicholas C. Seroff, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 132 days.

(21) Appl. No.: 13/313,950

(22) Filed: Dec. 7, 2011

(65) Prior Publication Data

US 2013/0148401 A1    Jun. 13, 2013

(51) Int. Cl.
*G11C 5/06* (2006.01)
*H01L 21/98* (2006.01)

(52) U.S. Cl.
USPC ............... 365/63; 438/108; 257/E21.705

(58) Field of Classification Search
None
See application file for complete search history.

(56) References Cited

U.S. PATENT DOCUMENTS

| | | | | |
|---|---|---|---|---|
| 5,107,586 A | * | 4/1992 | Eichelberger et al. | 29/830 |
| 5,434,745 A | * | 7/1995 | Shokrgozar et al. | 361/735 |
| 5,436,203 A | * | 7/1995 | Lin | 29/841 |
| 6,797,538 B2 | * | 9/2004 | Wallace | 438/109 |
| 6,806,568 B2 | * | 10/2004 | Schaper | 257/724 |
| 2001/0000929 A1 | * | 5/2001 | Gilleo | 257/795 |
| 2003/0006493 A1 | * | 1/2003 | Shimoishizaka et al. | 257/686 |
| 2008/0036050 A1 | * | 2/2008 | Lin et al. | 257/659 |

* cited by examiner

*Primary Examiner* — Hoai V Ho
*Assistant Examiner* — James G Norman

(57) ABSTRACT

Systems and methods are provided for stacked semiconductor memory devices. The stacked semiconductor memory devices can include a nonvolatile memory controller, a number of nonvolatile memory dies arranged in a stacked configuration, and a package substrate. The memory controller and the memory dies can be coupled to each other with vias that extend through the package substrate. A vertical interconnect process may be used to electrically connect the nonvolatile memory dies to each other, as well as other system components. The memory controller may be flip-chip bonded to external circuitry, such as another semiconductor device or a printed circuit board.

26 Claims, 6 Drawing Sheets

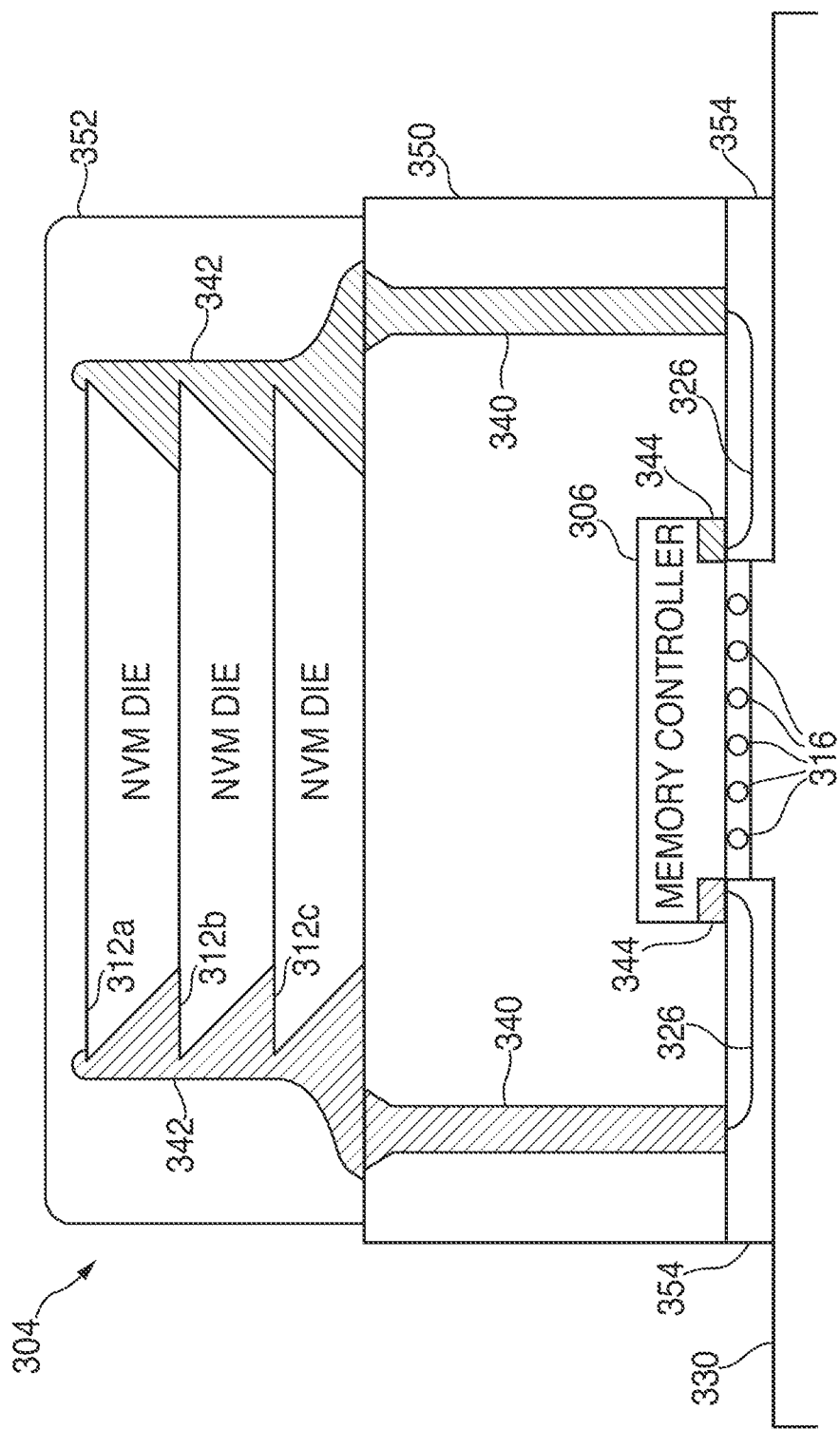

SYSTEMS AND METHODS FOR STACKED SEMICONDUCTOR MEMORY DEVICES

BACKGROUND

Various types of nonvolatile memory ("NVM"), such as flash memory (e.g., NAND flash memory and NOR flash memory), can be used for mass storage. For example, consumer electronic devices (e.g., portable media players) use flash memory to store data, including music, videos, images, and other media or types of information. An ongoing trend in the consumer electronic industry involves utilizing more and more NVM in smaller and smaller devices, creating the necessity for creative packaging solutions that increase data storage density.

SUMMARY

Systems and methods for stacked semiconductor memory devices are provided. A stacked semiconductor memory device can include a package substrate, a memory controller, and a number of NVM dies arranged in a stack. The memory controller may be coupled to the bottom of the package substrate in a flip-chip configuration to facilitate a direct connection between the memory controller and external circuitry (e.g., a host device). The stacked NVM dies can be coupled to the top of the package substrate. Vias extending from the top to the bottom of the package substrate can be included to electrically couple the NVM die stack to the memory controller. The memory controller may be connected to the vias with metallic traces and/or wire bonds and the NVM die stack can be connected to the vias (and each other) with conductive epoxy traces and/or wire bonds.

According to some embodiments, one or more discrete electronic components can be included in a stacked semiconductor device. Such discrete electronic components may include, for example, capacitors, resistors, inductors, diodes, etc. Discrete components can be incorporated into a stacked semiconductor package in any suitable configuration (e.g., embedded in or mounted to one or more sides of the package substrate). In some embodiments, a stacked semiconductor device may also be fully or partially encapsulated in an electromagnetic interference ("EMI") shield, which may prevent the emission of electromagnetic radiation from components of the device.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which:

FIG. 3 is an illustrative cross-sectional view of an NVM package in accordance with some embodiments;

DETAILED DESCRIPTION

Figure 1:
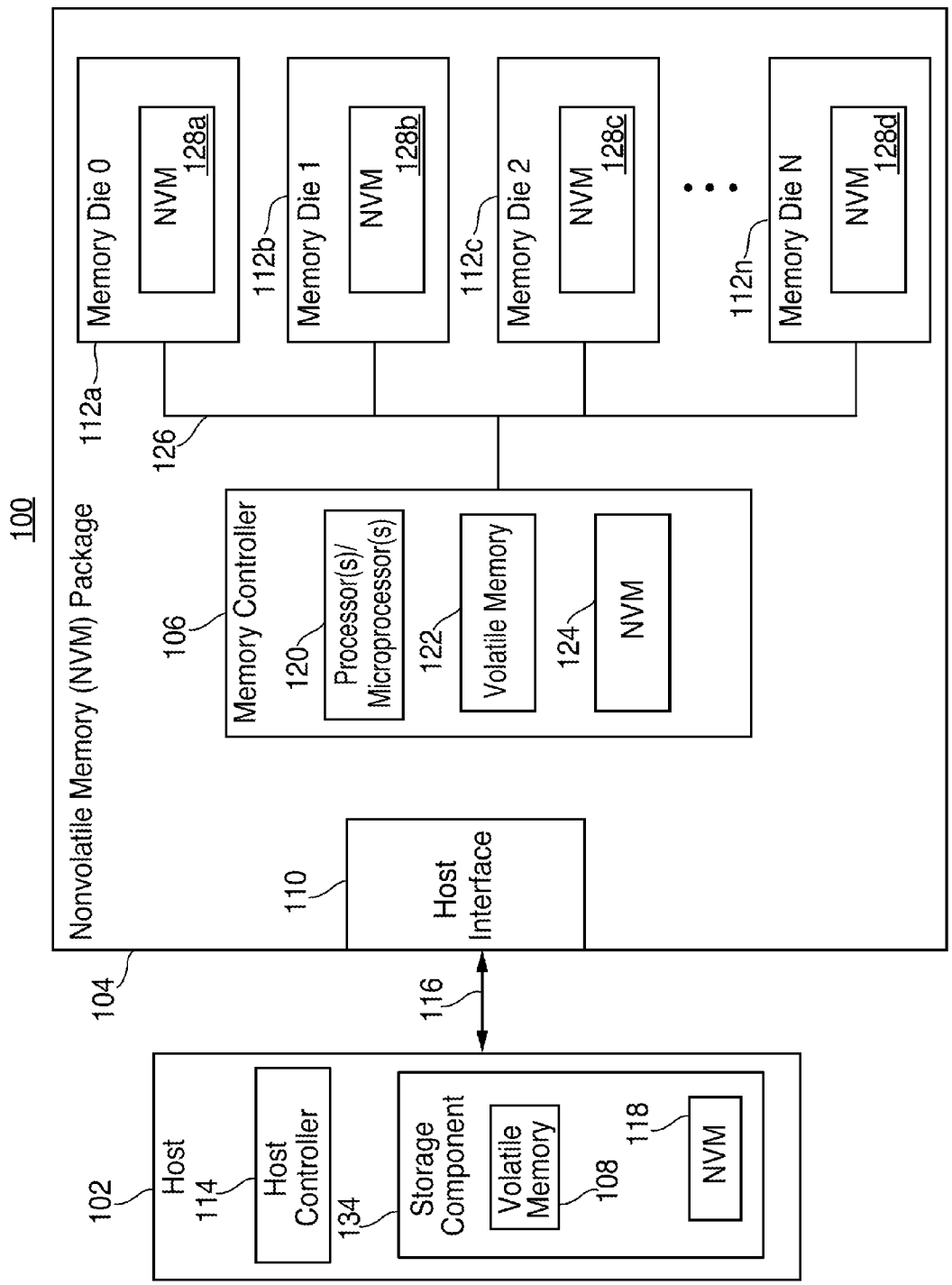
FIG. 1 is a diagram depicting an illustrative system that includes a host and an NVM package with a memory controller in accordance with various embodiments of the invention.

FIG. 1 is a diagram depicting system 100, including host 102 and NVM package 104. Host 102 may communicate with NVM package 104, which can include memory controller 106, host interface 110, and memory dies 112*a-n* with corresponding NVMs 128*a-n*. Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128*a-n* (e.g., in the memory dies 112*a-n*) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, program, and erase operations, to NVM package 104. Host controller 114 can include one or more processors and/or microprocessors that are configured to perform operations based on the execution of software and/or firmware instructions. Additionally and/or alternatively, host controller 114 can include hardware-based components, such as application-specific integrated circuits ("ASICs"), that are configured to perform various operations. Host controller 114 can format information (e.g., commands, data) transmitted to NVM package 104 according to a communications protocol shared between host 102 and NVM package 104.

Host 102 can include storage component 134, including volatile memory 108 and NVM 118. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a queue of memory operations to be sent to, or to store data received from, NVM package 104. Host 102 can use NVM 118 to persistently store a variety of information, including firmware, which can be used to control operations on host 102.

Host 102 can communicate with NVM package 104 over communications channel 116. Communications channel 116 can be fixed (e.g., fixed communications channel), detachable (e.g., universal serial bus (USB), serial advanced technology (SATA)), or wireless (e.g., Bluetooth™). Interactions with NVM package 104 can include providing access requests and transmitting data, such as data to be programmed to one or more of memory dies 112*a-n*, to NVM package 104. Communication over communications channel 116 can be received at host interface 110 of NVM package 104. Host interface 110 can be part of and/or communicatively connected to memory controller 106.

Like host controller 114, memory controller 106 can include one or more processors and/or microprocessors 120 that are configured to perform operations based on the execution of software and/or firmware instructions. Additionally and/or alternatively, memory controller 106 can include hardware-based components, such as ASICs, that are configured to perform various operations. Memory controller 106 can perform a variety of operations, such as performing access requests initiated by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

In some embodiments, memory controller 106 can be incorporated into the same package as memory dies 112a-n. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114).

Memory controller 106 may include volatile memory 122 and NVM 124. Volatile memory 122 can be any of a variety of volatile memory types, such as cache memory or RAM. Memory controller 106 can use volatile memory 122 to perform access requests and/or to temporarily store data that is being read from and/or written to NVMs 128a-n in memory dies 112a-n. For example, volatile memory 122 can store firmware and memory controller 106 can use the firmware to perform operations on NVM package 104 (e.g., read/program operations). Memory controller 106 can use NVM 124 to persistently store a variety of information, such as debug logs, instructions, and firmware that NVM package 104 uses to operate.

Memory controller 106 can use shared internal bus 126 to access NVMs 128a-n, which may be used for persistent data storage. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to memory dies 112a-n. Memory dies 112a-n can be physically arranged in a variety of configurations, including a stacked configuration, and may be, according to some embodiments, IC dies. According to some embodiments, memory dies 112a-n arranged in stacked configurations can be electrically coupled to memory controller 106 with conductive epoxy traces. These embodiments will be discussed in more detail with respect to FIGS. 3-5 below.

NVMs 128a-n can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof.

Figure 2:
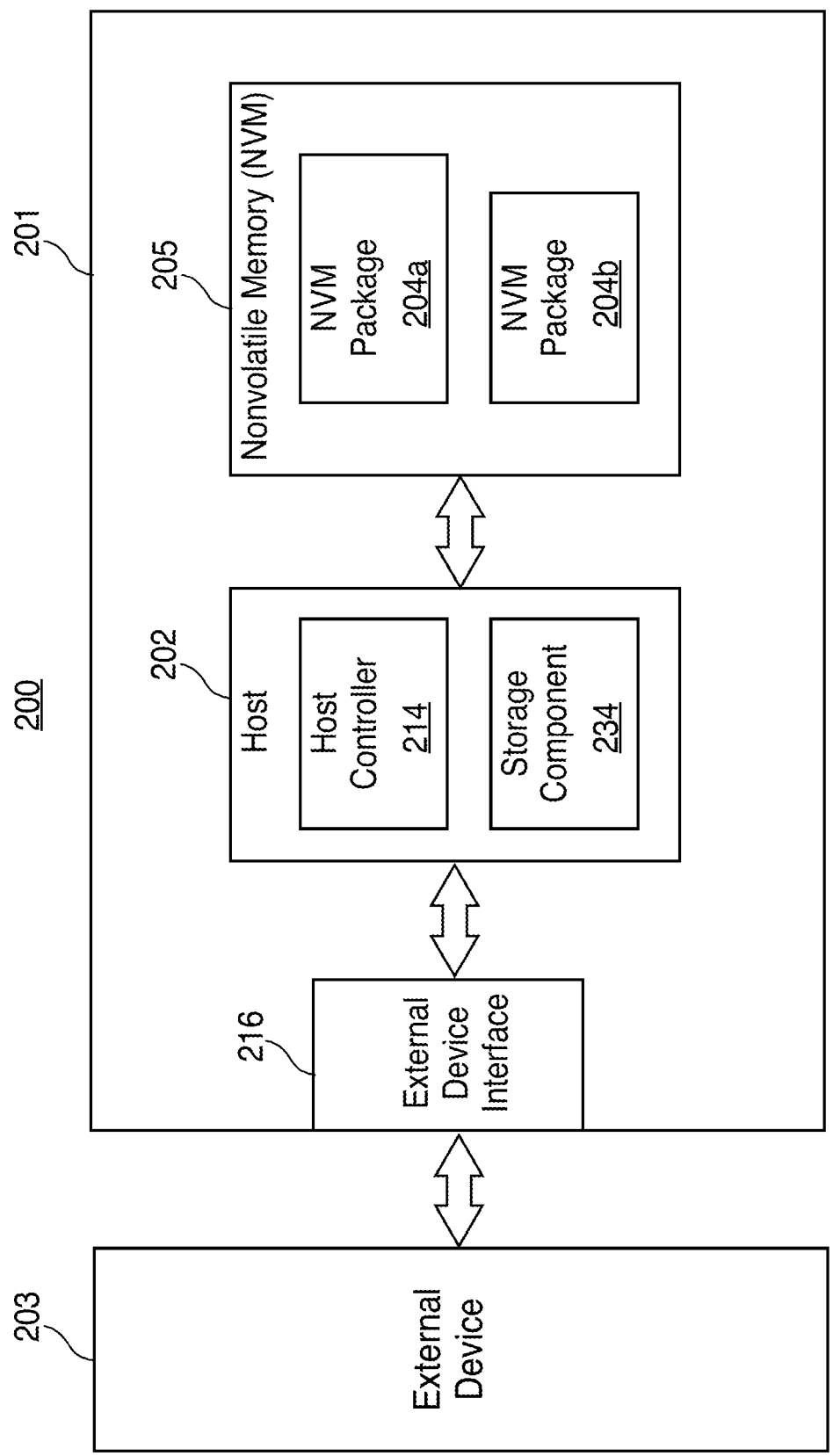
FIG. 2 is an illustrative system in accordance with various embodiments of the invention.

FIG. 2 is a diagram depicting illustrative system 200 that includes device 201. Device 201 can be any suitable electronic device, including a portable media player (e.g., an iPod), a cellular telephone (e.g., an iPhone), a pocket-sized personal computer, a personal digital assistant (PDA), a desktop computer, a laptop computer, a tablet computing device (e.g., an iPad), and/or a removable/portable storage device (e.g., a flash memory card, a USB flash memory drive).

Device 201 can include host 202 and NVM 205. Host 202 can be similar to the host 102 described above with regard to FIG. 1. Host 202 can include host controller 214 and storage component 234, which may include volatile memory and NVM (e.g., volatile memory 108 and NVM 118 of FIG. 1). Host controller 214 can include any suitable type of processors, including microprocessors, central processing units ("CPUs"), graphics processing units ("GPUs"), or any combination thereof.

NVM 205 can include one or more NVM packages 204a-b. NVM packages 204a-b can each be similar to NVM package 104 described above with regard to FIG. 1. For instance, the NVM packages 204a-b can each include a plurality of memory dies with NVMs (e.g., memory dies 112a-n and NVMs 128a-n), one or more memory controllers (e.g., memory controller 106), and one or more busses connecting the memory controllers to the memory dies (e.g., shared internal bus 126). Although only two NVM packages are shown in system 200, one skilled in the art will appreciate that NVM 205 can include any number (e.g., 2, 3, 4, 8, 16, etc.) of NVM packages As described above with regard to FIG. 1, management of NVM 205 can be performed by host controller 214 and/or controllers of the NVM packages 204a-b. In implementations where controllers of the NVM packages 204a-b control at least a portion of the memory management operations (e.g., error correction, wear leveling, etc.), the NVM packages 204a-b may be considered to be "managed" NVM.

System 200 is depicted as also including an external device 203 that can be communicatively connected (directly and/or indirectly) to device 201. Communication between external device 203 and device 201 can include the transmission of data and/or instructions between the two devices (e.g., access requests, data, and health information). External device 203 can be any of a variety of electronic devices, such as a desktop computer, a laptop computer, and a media computing device (e.g., a media server, a television, a stereo system). Device 201 can communicate with the external device 203 through a physical and/or wireless connection using an external device interface (e.g., wireless chip, USB interface, etc.). In some embodiments, device 201 can be a portable media player (e.g., an iPod) and the external device 203 can be a desktop computer that can transmit media files (e.g., audio files, video files, etc.) to each other over a physical connection (e.g., USB cable).

FIG. 3 is an illustrative cross-sectional view of NVM package 304 in accordance with some embodiments. NVM package 304 can include memory controller 306, memory dies 312a-c, and external circuitry 330. NVM package 304, memory controller 306, and memory dies 312a-c can correspond to, for example, NVM package 104, memory controller 106, and memory dies 112a-c of FIG. 1, respectively. NVM package 304 can also include interconnect elements, including solder bumps 316, metal traces 326, vias 340, and epoxy traces 342. The above elements can be encapsulated in package substrate 350, electromagnetic interference ("EMI") shield 352, and substrate routing member 354 to stabilize, electrically isolate, and otherwise protect NVM package 304. Although embodiments described herein refer to specific semiconductor dies (e.g., memory controllers and memory dies), one skilled in the art will appreciate that a semiconductor package (e.g., NVM package 304) may incorporate any suitable combination of semiconductor dies. For example, a package might include a microprocessor die connected to a stack of other semiconductor dies, including volatile memory, nonvolatile memory, and/or one or more analog circuit dies.

NVM package 304 is an example of a stacked semiconductor die configuration because one or more individual semiconductor chips (e.g., memory dies 312a-c and memory controller 306) are arranged in a vertical configuration. Stacked semiconductor die configurations can provide a number of advantages over circuit board configurations in which individual semiconductor chips are mounted laterally on a circuit board. For example, dies in stacked configurations have a smaller "footprint," which can be beneficial in applications where a small overall device size is desired. In fact, because the footprint of the package can be very close to the dimensions of the largest semiconductor chip, NVM package 304 may be referred to as a "stack-scale package." Stacking memory dies also increases the data storage density of an electronic device, allowing more data to be stored in the same physical space.

As shown in FIG. 3, memory controller 306 can be bonded with any suitable adhesive (e.g., an epoxy) to package substrate 350, which may be formed using a compression molding or injection molding process. In these embodiments, package substrate 350 can be shaped like a block with a recess for memory controller 306. The backside of memory controller 306 can be bonded to package substrate 350 such that the active surface of memory controller 306 is facing away from package substrate 350 to enable flip-chip bonding to external circuitry. In alternative embodiments, the active surface of memory controller may be configured to face toward package substrate 350 with electrical wiring being routed inside package substrate 350.

To prevent damage to NVM package 304 during operation or in extreme conditions, package substrate 350 and memory controller 306 may be made of materials with similar coefficients of thermal expansion. For example, memory controller 306 can be an integrated circuit processed on a Si wafer and package substrate 350 can be a silicone rubber compound. In other embodiments, memory controller 306 can be processed on any suitable substrate (e.g., Ge, GaAs, InP) and package substrate 350 can be any suitable encapsulate material that provides physical and environmental protection for memory controller 306. Package substrate 350 may also be chosen to efficiently dissipate heat from memory controller 306. Although package substrate 350 is depicted as being several times thicker than memory controller 306, package substrate 350 can be any suitable thickness. For example, in applications where vertical dimensions are critical, package substrate 350 can be made as thin as possible while still maintaining structural integrity and electronic isolation.

In some other embodiments, package substrate 350 can be formed around memory controller 306 in an overmolding process. Such a process may involve placing memory controller 360 into a mold and forming the package substrate around it using, for example, an injection molding process. Certain precautions (e.g., use of a low or ambient temperature/pressure molding process) may be required to prevent damage to the memory controller in these embodiments. Nevertheless, overmolding can reduce complexity in the manufacturing process by obviating the need for a separate step for coupling a memory controller to an existing package substrate.

Package substrate 350 can include conductive pathways (vias 340) that extend from one surface of package substrate 350 to an opposite surface. The holes that form vias 340 can be created in package substrate 350 using any suitable process. In some embodiments, the holes can be created during the molding process. In other embodiments, the holes can be created after package substrate 350 is formed. For example, the holes may be drilled mechanically or etched using, for example a Reactive Ion Etch ("RIE") process. The holes can then be filled with a conductive material to form vias 340. The conductive material can be any material suitable for the purpose. According to some embodiments, the hole can be metalized using an electroplating process or other suitable metallization process. In other embodiments, the holes can be filled with a conductive epoxy. Bond pads may be formed where vias 340 emerge from the surface of package substrate 350 to facilitate connections between vias 340 and other elements of NVM package 304. In embodiments where the active side of memory controller 306 faces package substrate 350, additional vias 340 may be included to directly contact the active surface of memory controller 306.

Memory controller 306 can be electrically connected to bond pads of vias 340 with metal traces 326. According to some embodiments, metal traces 326 can be deposited on the surface of substrate routing member 354 using, for example, a tape-automated bonding ("TAB") process or a lithographic printing process. Substrate routing member may then be physically coupled to package substrate 350 with, for example, an adhesive. Additionally, metal traces 326 may be electrically coupled to memory controller 306 and vias 340 using any suitable process, including flip-chip bonding. In these embodiments, substrate routing member 354 may be molded of the same material as package substrate 350; however, substrate routing member 354 may be made of any suitable material and using any suitable process.

According to some other embodiments, metal traces 326 can be formed by wire bonding. The wire bonding process involves attaching flexible wires from bond pads on memory controller 306 to the bond pads of vias 340. The wires may be any suitable highly-conductive, ductile metal (e.g., Al, Au, Cu). Depending on the number of required external connections, the bond pads on memory controller 306 and package substrate 350 may be staggered. Staggering the bond pads can decrease the bond-pad pitch (the center to center distance between bond pads) and allow more external connections than inline bond pads. Staggered bond pads may require the bond pads on package substrate 350 to be terraced to prevent shorting between adjacent wires. In other embodiments, metal traces 326 can be deposited directly on the surface of package substrate 350 using, for example, a tape automated bonding ("TAB") process or a lithographic printing process.

After metal traces 326 are wire bonded and memory controller 306 is electrically connected to vias 340, metal traces 326 can be encapsulated in a material to form substrate routing member 354. The material used to form substrate routing member 354, according to these embodiments, can be any suitable nonconductive material (e.g., plastic, epoxy resin) and may be deposited with any suitable process (e.g., spin coating, transfer molding). In embodiments where substrate routing member 354 material is deposited over the entire active surface of memory controller 306, subsequent process steps may be necessary to open a window in substrate routing member 354 to facilitate further electrical connections. In some embodiments, dielectric coating material 354 can be made of the same (or similar) material as package substrate 350 to prevent damage to NVM package 304 from coefficient of thermal expansion mismatch.

NVM package 304 can further include several memory dies 312a-c. Although only three memory dies are shown in FIG. 3, one skilled in the art will appreciate that any number of memory dies can be incorporated into NVM package 304, subject to space, wiring, and/or structural limitations. Memory dies 312a-c can be arranged in a stacked configuration and affixed to the surface of package substrate 350 opposite memory controller 306 with any suitable adhesive (e.g., an epoxy).

Individual memory dies, according to some embodiments, can be stacked and interconnected using vertical interconnects. A vertical interconnect process, according to some embodiments, can involve fabricating semiconductor die on wafers with edge bond pads in a normal semiconductor fabrication process. The wafers may be thinned using a grinding process and diced (cut away from the wafer with a circular diamond-impregnated dicing saw). In some embodiments, individual die can be diced from the backside of the wafer to create a beveled edge profile. The die can then be cleaned to remove residue left by the dicing process. After cleaning, a suitable insulating thin film (e.g., silicon nitride ("SiN")) can be deposited on the backside of each die to prevent crosstalk between stacked die.

Next, individual memory dies 312a-c can be stacked and glued together. In some embodiments, an epoxy can be introduced between each memory die. The stack can then be aligned to ensure that the edge bond pads of each die are in vertical alignment. Finally, the epoxy can be cured to solidify the stack of memory dies. The stack of memory dies 312a-c can then be affixed to package substrate 350 using any suitable method. According to some embodiments, the stack of memory dies 312a-c can be epoxied to package substrate 350 at the same time the stack itself is being formed.

To provide electrical connection between individual memory die, as well as other components of NVM package 304, epoxy traces 342 can be applied to memory dies 312a-c with an applicator. Epoxy traces 342 can be applied to contact the edge bond pads of memory dies 312a-c, which may be disposed beneath the beveled edge of an adjacent memory die. In this way, the beveled edges provide access to the edge bond pads and lend extra support to epoxy traces 342. As depicted in FIG. 3, epoxy traces 342 can be applied to connect memory dies 312a-c to vias 340. In these embodiments, epoxy traces 342 can be applied along the surface of package substrate 350 to electrically connect the edge bond pads of memory dies 312a-c to bond pads of vias 340. In other embodiments, edge bond pads of memory dies-312a-c can be electrically coupled to vias 340 using a wire bonding process. Through this vertical interconnect process, memory dies 312a-c can be communicatively coupled to memory controller 306. Metal traces 326, vias 340, and epoxy traces 342 combined can represent, for example, shared internal bus 126 of FIG. 1. The vertical interconnect process is described in more detail with respect to FIG. 5 below.

In addition to bond pads 344, memory controller 306 can include solder bumps 316, which can be used for flip-chip bonding memory controller 306 to external circuitry 330. In general, flip-chip bonds can reduce the chip-to-package interconnect length in comparison with other bonding methods (e.g., wire bonding and TAB bonding), resulting in reduced inductance and, therefore, improved high-speed signal integrity. Solder bumps 316 may be added to memory controller dies during wafer processing. NVM package 304 can then be flipped upside down (as shown in FIG. 3) for connection to external circuitry 330. When memory controller 306 and external circuitry 330 are properly aligned, solder bumps 316 can be reflowed to create an electrical connection between memory controller 306 and external circuitry 330. An underfill adhesive may be added between memory controller 306 and external circuitry 330 to reduce stress on solder bumps 316.

According to some embodiments, external circuitry 330 can be a semiconductor substrate. For example, external circuitry may be a host controller for a board-level host device (e.g., host controller 114 of host 102). In these embodiments, solder bumps 316 can represent communications channel 116 of FIG. 1, which facilitates communication between host controller 114 and memory controller 106. In other embodiments it may not be possible to mount memory controller 306 directly to a host controller. For example, the host controller may not have enough surface area to accommodate memory controller 306 and additional external interfaces required to connect the host controller to other system components. In these embodiments, external circuitry 330 may be a printed circuit board with conductive leads that facilitate connectivity between multiple components of a system. For instance, memory controller 306 of NVM package 304 can be flip-chip bonded to a circuit board (external circuitry 330), and printed conductors can electrically couple memory controller 306 to a host controller (e.g., host controller 114 of FIG. 1) or other system components.

NVM package 304 may also include one or more discrete electronic components, according to some embodiments. The discrete components can include capacitors, inductors, resistors, or any other active or passive electronic component. These discrete components can be incorporated into package substrate 350 concurrently with memory controller 306. For example, discrete components may be embedded in package substrate 350 during a molding process. Alternatively, discrete components may be coupled to package substrate 350 separately using an adhesive. The discrete components can be electrically coupled to other system components (e.g., memory controller 306, memory dies 312a-c, and/or external circuitry 330) using any combination of vias 340 and metal traces 326.

NVM package 304 may be fully or partially encapsulated in an electromagnetic interference EMI shield 352. EMI shield 352 may prevent the emission of electromagnetic radiation from components of NVM package 304. Similarly, EMI shield 352 may prevent damage to components of NVM package 304 from electromagnetic and/or radiofrequency interference emitted by external sources. In general, EMI shield 352 can function as a Faraday cage, which can block the propagation of electric and/or electromagnetic fields. Furthermore, EMI shield 352 may be coupled to ground in order to dissipate electric charge. As shown in FIG. 3, EMI shield 352 may be a "can" type EMI shield that encloses a portion or all of NVM package 304. According to some embodiments, the space within EMI shield 352 may be empty (e.g., filled with air). In other embodiments, the space within EMI shield 352 may be filled with a suitable dielectric material. EMI shield 352 may also, according to some embodiments, be deposited over a dielectric encapsulate material as a conformal conducting thin film using standard coating techniques (e.g., physical vapor deposition ("PVD"), chemical vapor deposition ("CVD"), spin coating, etc.).

Figure 4A:
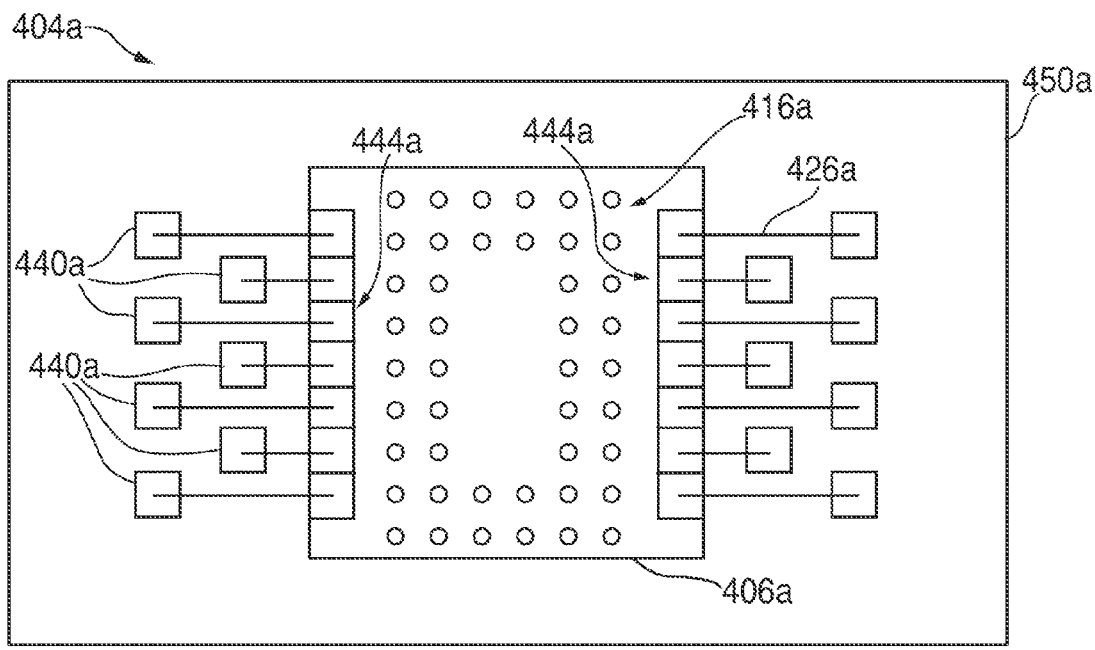
FIGS. 4A and 4B are illustrative views of the underside of an NVM package in accordance with various embodiments of the invention.

FIG. 4A is an illustrative view of the underside of NVM package 404a in accordance with some embodiments. NVM package 404a includes package substrate 450a, memory controller 406a, bond pads 444a, solder bumps 416a, metal traces 426a, and via bond pads 440a. The active side of memory controller 406a can be covered with solder bumps 416a for flip-chip connection to external circuitry (e.g., external circuitry 330 of FIG. 3). Solder bumps 416a may use any suitable ratio of Pb/Sn. However, a high Pb solder with a relatively high melting point may be preferable because NVM package 304 may require one or more high temperature heating cycles (e.g., for curing epoxy) before solder bumps 414a are reflowed (e.g., for connecting memory controller 406a to external circuitry). Solder bumps 416a may be arranged in any suitable configuration on the surface of memory controller 406a.

Figure 4B:
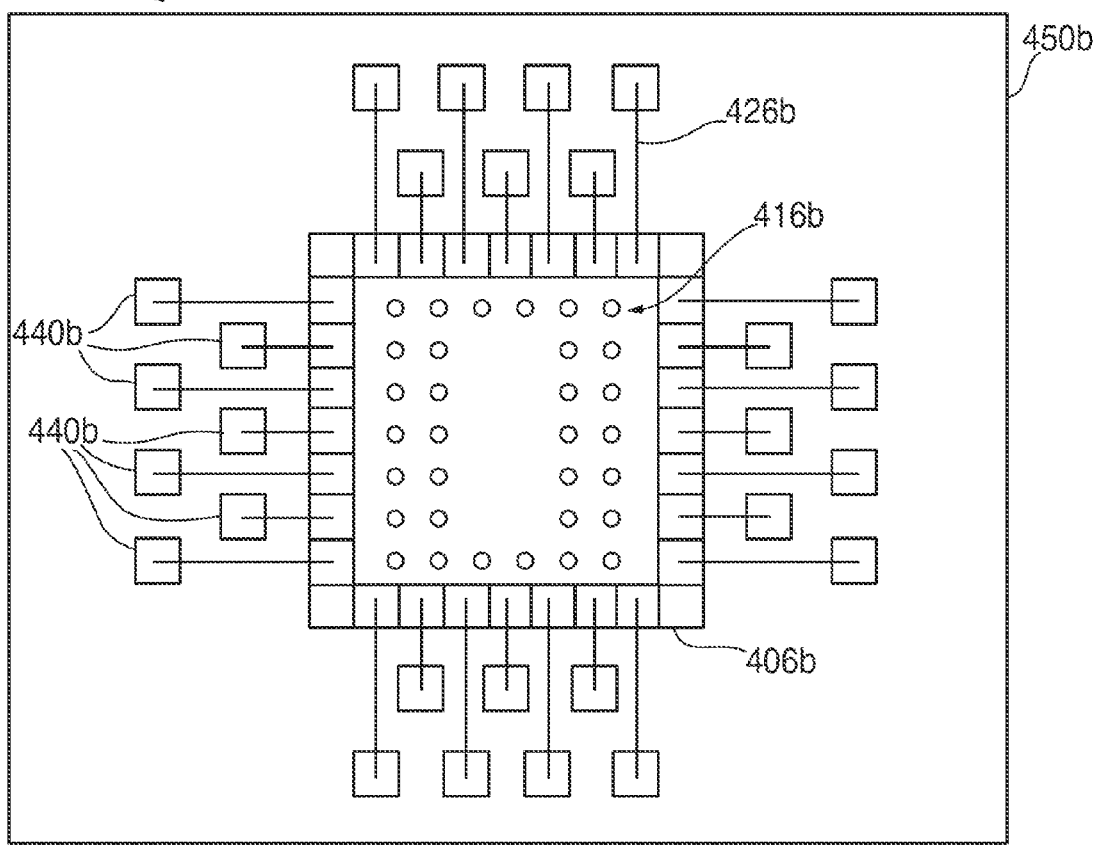

According to some embodiments, metal traces 426a can be wire bond wires. Bond wires can be joined to bond pads 444a on memory controller 406a to bond pads 440a, which may be electrically coupled to vias inside package substrate 450a. As depicted in FIG. 4A, bond pads 440a can be staggered to decrease bond pad pitch and increase the number of external connections available to NVM package 304. Bond pad pitch may be further decreased in some embodiments, by terracing the inner and outer sets of bond pads 440a. To decrease the overall footprint of NVM package 404a, bond pads 440a may be provided on only two sides of memory controller 406a. However, as depicted in FIG. 4B, bond pads 440b may be provided on all four sides of memory controller 406b to increase the number of available external connections in NVM package 404b.

Figure 5:
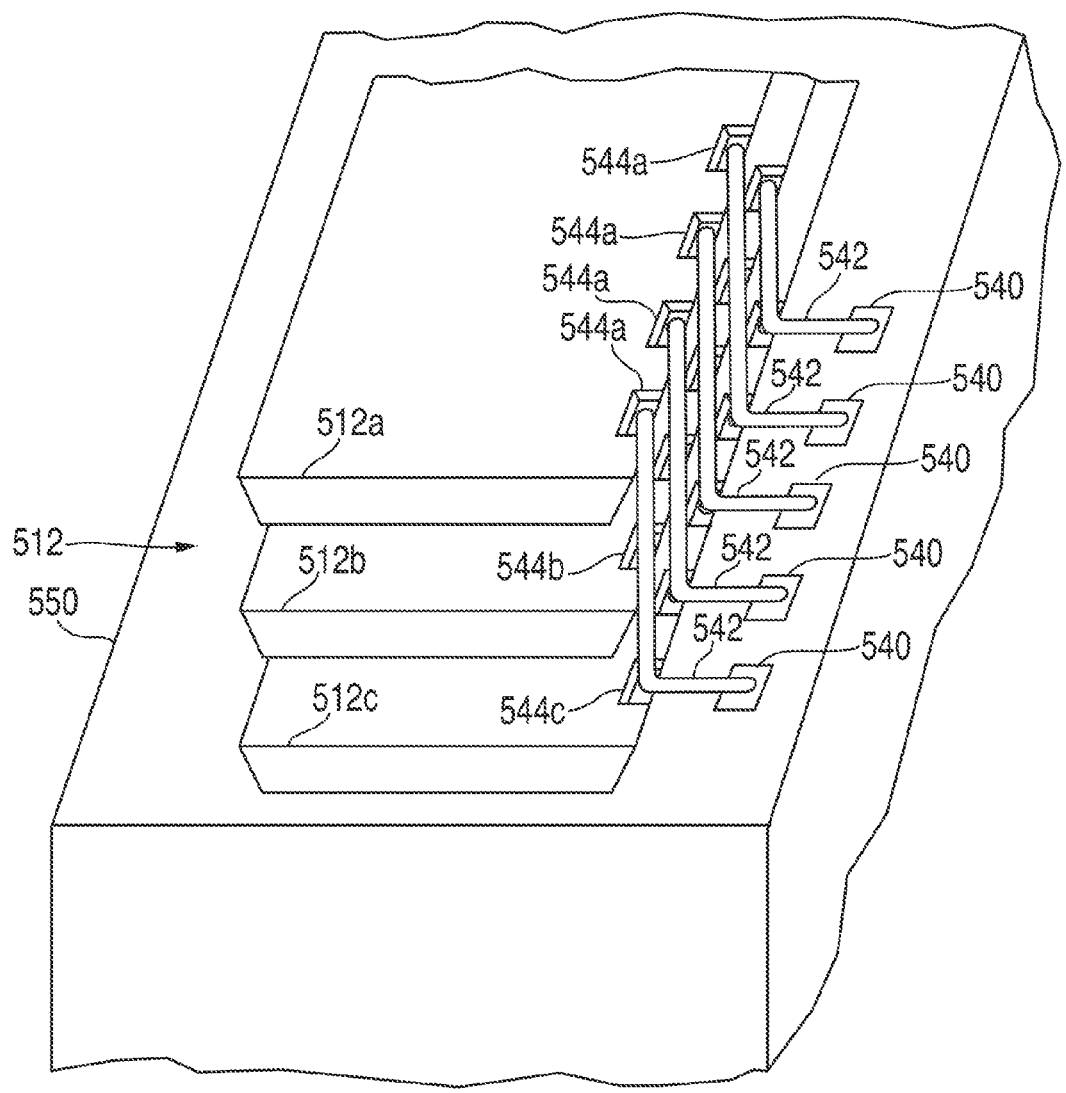
FIG. 5 is a perspective view of an NVM die stack coupled to a package substrate in accordance with various embodiments of the invention.

FIG. 5 is a perspective view of NVM die stack 512 coupled to package substrate 550 in accordance with various embodiments. NVM die stack 512 can include a number of NVM dies 512a-c, which in turn may include a number of edge bond pads 544-c. NVM die stack 512 can be coupled to package substrate 550 with a suitable adhesive, as described above with respect to FIG. 3. NVM die stack 512 may include vias 540 that extend through die stack 512 to couple with an IC on the opposite side (not shown).

Individual edge bond pads of NVM die stack 512 can be electrically coupled to vias 540, as well as other vertically aligned edge bond pads in NVM die stack 512 with one or more conductive epoxy traces 542. Epoxy traces 542 may be made conductive by adding a conductive material (e.g., silver) to the epoxy. Epoxy traces 523 may then be selectively dispensed with an applicator (not shown) to interconnect vertically aligned edge bond pads 544a-c and vias 540. For example, a particular epoxy trace may only interconnect two adjacent and vertically aligned bond pads. Other epoxy traces may be applied to interconnect a via to all of the NVM dies in NVM die stack 512 through a set of vertically aligned bond pads. The beveled edges of NVM dies 512a-c provide access to edge bond pads 544a-c and physical support to the applied epoxy traces. According to some embodiments, the application of epoxy traces 542 may be automated; however, epoxy traces 542 may also be applied manually. Additionally, as discussed above, wire bonds may be substituted for epoxy traces 542 to effect electrical connection between edge bond pads 544a-c and vias 540. Although edge bond pads 544a-c are only depicted on one side of NVM die stack 512, as discussed above with respect to FIGS. 4A and 4B, edge bond pads can be included in any number of sides of NVM die stack 512.

Figure 6:
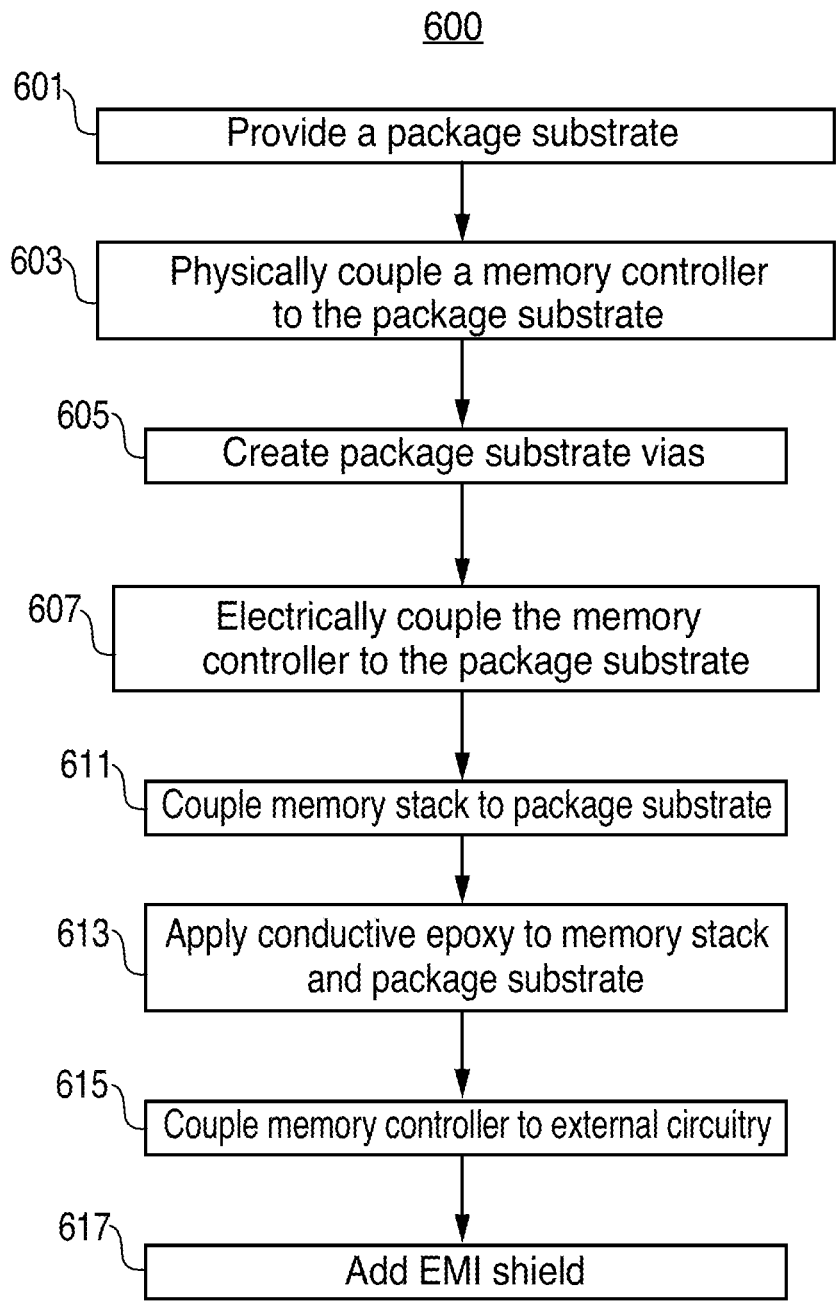
FIG. 6 is a flowchart of process for manufacturing a stacked semiconductor memory device in accordance with some embodiments.

FIG. 6 is a flowchart of process 600 for manufacturing a stacked semiconductor memory device. At step 601, a package substrate (e.g., package substrate 350 of FIG. 3) can be provided. The package substrate can be formed using, for example, an injection molding process. Next, at step 603 a memory controller (e.g., memory controller 306 of FIG. 3) can be physically coupled to the package substrate. In some embodiments, the memory controller can be incorporated into the package substrate in a flip-chip configuration. In these embodiments, the backside of the memory controller can be coupled to the bottom of the package substrate with an adhesive (e.g., an epoxy). The active side of the memory controller can include a number of solder bumps that allow direct connection between the memory controller and external circuitry. The package substrate material can be chosen such that its coefficient of thermal expansion is similar to that of the memory controller.

According to some embodiments, steps 601 and 603 may be combined in an overmolding process. For instance, a memory controller and one or more discrete electronic elements (e.g., capacitors, resistor, inductors, etc.) can be inserted into a mold, and then the package substrate can be formed around these elements. Certain precautions (e.g., use of a low or ambient pressure molding process) may be required to prevent damage to the memory controller and the discrete electronic elements during the overmolding process. Nevertheless, overmolding can reduce complexity in the manufacturing process by obviating the need for a separate step for coupling a memory controller and discrete electronic elements to an existing package substrate.

At step 605 vias can be formed in the package substrate. According to some embodiments, the holes that will form the vias can be formed during the molding process. In other embodiments, holes can be created after the package substrate is fully formed. For example, the holes may be formed using a mechanical drilling process or an anisotropic etching process (e.g., reactive ion etch ("RIE")). The holes can then be filled with a conductive material to provide an electrical pathway from the top of the package substrate to the bottom. The conductive material may be a metal (e.g., electroplated Cu) or a conductive liquid (e.g., a conductive epoxy). In some embodiments, bond pads (e.g., Al contacts) can be formed at the ends of each via to facilitate electrical connections to other components of the stacked semiconductor memory device. The bond pads may be deposited and patterned using a standard lithography process.

At step 607, the memory controller can be electrically coupled to the vias. As described above with respect to FIG. 3, in some embodiments bond pads of the memory controller can be connected to bond pads of the vias via metal traces in a substrate routing member. The metal traces may be deposited using, for example, a tape-automated bonding ("TAB") process or a lithographic printing process. The metal traces may connect to the memory controller and the vias using solder balls in a flip-chip bonding process. In other embodiments, the memory controller can be electrically coupled to the vias using a wire bonding process. To protect the connections between the memory controller and the vias, the bottom of the package substrate (including, according to some embodiments, the memory controller) can be coated with an insulating material. To prevent damage to the stacked semiconductor memory device, the coefficient of thermal expansion of the coating material can be chosen to coincide with that of the package substrate and the memory controller. In embodiments where the memory controller will be flip-chip bonded to external circuitry, a window may be opened in the coating material to allow access to the memory controller.

At step 609 a stack of NVM dies (e.g., memory dies 312a-c) can be coupled to the top of the package substrate with a suitable adhesive. Any number of NVM dies can be included in the stack, subject to space, wiring, and/or structural limitations. Each NVM die can be coupled physically to an adjacent die with a suitable adhesive, and the dies may be arranged such that edge bond pads of die are in vertical alignment. At step 611, the edge bond pads of the NVM die stack can be electrically coupled together, and to bond pads on the top of the package substrate, using conductive epoxy traces or wire bonds as described above with respect to FIG. 3.

At step 613, the memory controller can be electrically coupled to external circuitry (e.g., external circuitry 330 of FIG. 3). The external circuitry may be any substrate suitable to communicate with the memory controller. For example, the external circuitry may be a printed circuit board or the host controller (e.g., host controller 114 of FIG. 1) of a host device. In embodiments where the memory controller includes solder bonds to facilitate a flip-chip connection to the external circuitry, the memory controller can be aligned with the external circuitry, and the solder balls can be reflowed to create an electrical connection. An underfill adhesive may then be added between the memory controller and the external circuitry to reduce stress on solder bumps.

Next, at step 615, an EMI shield (e.g., EMI shield 352 of FIG. 3) can be added to the stacked semiconductor memory device. The EMI shield may be a hollow can-type EMI shield that can cover all or part of the stacked semiconductor memory device. In some embodiments, the space between the EMI shield and the components of the memory device can be filled with a dielectric material. In those embodiments, a conductive thin film can be deposited on the dielectric material to form the EMI shield. To dissipate charge, the EMI shield can be wired to ground (e.g., a ground pin on a nearby circuit board).

It is to be understood that the steps shown in process 600 of FIG. 6 are merely illustrative and that existing steps may be modified or omitted, additional steps may be added, and the order of certain steps may be altered.

While there have been described systems and methods for stacked semiconductor memory devices, it is to be understood that many changes may be made therein without departing from the spirit and scope of the invention. Insubstantial changes from the claimed subject matter as viewed by a person with ordinary skill in the art, no known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A stacked semiconductor package comprising:
   a package substrate;
   an integrated circuit die comprising a backside and an active side, wherein the backside of the memory controller is physically coupled to a first side of the package substrate, and wherein the active side of the integrated circuit die includes a plurality of bond pads and a plurality of flip-chip solder bumps;
   a die stack comprising a plurality of semiconductor dies, wherein:
      the plurality of semiconductor dies are physically coupled to one another;
      the plurality of semiconductor dies are electrically coupled to one another with a plurality of conductive epoxy traces; and
      the die stack is physically coupled to a second side of the package substrate, wherein the second side of the package substrate is opposite the first side of the package substrate;
   a plurality of electrically conductive vias extending from the first side of the package substrate, through the package substrate, to the second side of the package substrate, wherein:
      the plurality of electrically conductive vias are electrically coupled on the first side of the package substrate to the plurality of bond pads of the integrated circuit die; and
      the plurality of electrically conductive vias are electrically coupled on the second side of the package substrate to the die stack via the conductive epoxy traces.

2. The stacked semiconductor package of claim 1, wherein the integrated circuit die is a memory controller and the plurality of semiconductor dies comprises a plurality of NVM dies.

3. The stacked semiconductor package of claim 2, further comprising external circuitry coupled to the plurality of flip-chip solder bumps of the memory controller.

4. The stacked semiconductor package of claim 3, wherein the external circuitry comprises a semiconductor die.

5. The stacked semiconductor package of claim 3, wherein the external circuitry comprises a printed circuit board.

6. The stacked semiconductor package of claim 3, further comprising an underfill adhesive between the memory controller and the external circuitry.

7. The stacked semiconductor package of claim 2, wherein each of the plurality of NVM dies include a plurality of edge bond pads.

8. The stacked semiconductor package of claim 7, wherein the conductive epoxy electrically couples together the plurality of NVM dies by contacting a subset of the plurality of edge bond pads.

9. The stacked semiconductor package of claim 2, wherein the plurality of electrically conductive vias are electrically coupled on the first side of the package substrate to the plurality of bond pads of the memory controller with a plurality of metal traces.

10. The stacked semiconductor package of claim 2, wherein the plurality of electrically conductive vias are electrically coupled on the first side of the package substrate to the plurality of bond pads of the memory controller with a plurality of wire bonds.

11. The stacked semiconductor package of claim 2, wherein memory controller is electrically and physically coupled to an external circuit with the plurality of flip-chip solder bumps.

12. A method for manufacturing a stacked semiconductor package that includes a package substrate and an integrated circuit, comprising:
   physically coupling a back side of the integrated circuit in a flip-chip configuration to a first side of the package substrate;
   forming a plurality of electrically conductive vias in the package substrate that extend from the first side of the package substrate to a second side of the package substrate;
   electrically coupling an active side of the integrated circuit to the plurality of electrically conductive vias on the first side of the package substrate; and
   physically coupling a stack of semiconductor dies to the second side of the package substrate and electrically coupling the stack of semiconductor dies to the plurality of electrically conductive vias on the first side of the package substrate with electrically conductive epoxy traces, wherein the back side of the integrated circuit faces the stack of semiconductor dies.

13. The method of claim 12, wherein the integrated circuit is a memory controller and the stack of semiconductor dies comprises nonvolatile memory dies.

14. The method of claim 12, wherein electrically coupling the integrated circuit to the plurality of electrically conductive vias on the first side of the package substrate comprises coupling the memory controller to the electrically conductive vias with metal traces.

15. The method of claim 12, wherein the integrated circuit comprises a plurality of flip-chip solder bumps.

16. The method of claim 15, further comprising electrically and physically coupling the memory controller to external circuitry with the plurality of flip-chip solder bumps.

17. The method of claim 16, further comprising adding an underfill adhesive between the integrated circuit and the external circuitry.

18. The method of claim 12, further comprising encapsulating at least a portion of the stacked semiconductor package in an electromagnetic interference ("EMI") shield.

19. The method of claim 12, wherein forming a plurality of electrically conductive vias comprises filling a plurality of holes with an electrically conductive material, wherein the plurality of holes are created during a molding process that forms the package substrate.

20. The method of claim 12, wherein forming a plurality of electrically conductive vias comprises filling a plurality of holes with an electrically conductive material, wherein the plurality of holes are created subsequent to a molding process that forms the package substrate.

21. The method of claim 12, wherein the integrated circuit is physically coupled to the first side of the package substrate during a molding process that forms the package substrate.

22. The method of claim 12, wherein the integrated circuit is physically coupled to the first side of the package substrate with an adhesive.

23. The method of claim 12, further comprising:
embedding at least one discrete electronic element in the package substrate; and
electrically coupling the at least one discrete electronic element to the integrated circuit.

24. A method for manufacturing a stacked semiconductor package, the method comprising:
providing a package substrate;
physically coupling an integrated circuit in a flip-chip configuration to a first side of the package substrate;
forming a plurality of electrically conductive vias in the package substrate that extend from the first side of the package substrate to a second side of the package substrate;
electrically coupling the integrated circuit to the plurality of electrically conductive vias on the first side of the package substrate;
physically coupling a stack of semiconductor dies to the second side of the package substrate and electrically coupling the stack of semiconductor dies to the plurality of electrically conductive vias on the first side of the package substrate with electrically conductive epoxy traces, wherein electrically coupling the integrated circuit to the plurality of electrically conductive vias on the first side of the package substrate comprises wire bonding wires between a plurality of bond pads on the memory controller and bond pads electrically connected to the plurality of electrically conductive vias.

25. A stacked semiconductor package comprising:
a package substrate;
an integrated circuit die embedded at a first surface of the package substrate; and
a die stack comprising a plurality of semiconductor dies mounted on a second surface of the package substrate, wherein:
the integrated circuit die is embedded in the package substrate between the first and second surfaces;
the plurality of semiconductor dies are electrically coupled to the integrated circuit die with a plurality of electrically conductive vias; and
the electrically conductive vias extend from the first side of the package substrate to the second side of the package substrate.

26. The stacked semiconductor package of claim 25, wherein the plurality of semiconductor dies have beveled edges.

* * * * *